(12) United States Patent
Wang et al.

(10) Patent No.: US 11,507,152 B2
(45) Date of Patent: Nov. 22, 2022

(54) STORAGE CHASSIS

(71) Applicants: Inventec (Pudong) Technology Corporation, Shanghai (CN); INVENTEC CORPORATION, Taipei (TW)

(72) Inventors: Shu-Min Wang, Shanghai (CN); Ji-Peng Xu, Shanghai (CN)

(73) Assignees: INVENTEC (PUDONG) TECHNOLOGY CORPORATION, Shanghai (TW); INVENTEC CORPORATION, Taipei (TW)

( * ) Notice: Subject to any disclaimer, the term of this patent is extended or adjusted under 35 U.S.C. 154(b) by 701 days.

(21) Appl. No.: 16/541,396

(22) Filed: Aug. 15, 2019

(65) Prior Publication Data
US 2020/0409434 A1    Dec. 31, 2020

(30) Foreign Application Priority Data
Jun. 26, 2019  (CN) .......................... 201910562278.0

(51) Int. Cl.
| G06F 1/20 | (2006.01) |
| G06F 1/18 | (2006.01) |
| H05K 7/14 | (2006.01) |
| H05K 7/20 | (2006.01) |

(52) U.S. Cl.
CPC ............... *G06F 1/20* (2013.01); *G06F 1/183* (2013.01); *H05K 7/1492* (2013.01); *H05K 7/20736* (2013.01)

(58) Field of Classification Search
CPC ............ G06F 1/20; G06F 1/183; G06F 1/187; H05K 7/1492; H05K 7/20736; G11B 33/127; G11B 33/142; G11B 33/04
USPC ......................................................... 454/184
See application file for complete search history.

(56) References Cited

U.S. PATENT DOCUMENTS

| 8,373,983 B2 * | 2/2013 | Zhang ................... H05K 7/1491 |
| | | 174/559 |
| 8,929,024 B1 * | 1/2015 | Sorenson, III ........ G06F 3/0617 |
| | | 360/98.05 |
| 2012/0250247 A1 * | 10/2012 | Chien ..................... G06F 1/187 |
| | | 361/679.48 |
| 2013/0050955 A1 * | 2/2013 | Shinsato ................. G06F 1/181 |
| | | 361/727 |

(Continued)

*Primary Examiner* — Steven B Mcallister
*Assistant Examiner* — Charles R Brawner
(74) *Attorney, Agent, or Firm* — Locke Lord LLP; Tim Tingkang Xia, Esq.

(57) ABSTRACT

This disclosure provides storage chassis including base storage sub-assemblies and partitions. Base includes bottom plate, top plate, first side plate and second side plate. Front side of bottom plate is opposite to back side of bottom plate. Bottom plate is located opposite to top plate. First side plate is located opposite to second side plate. First side plate and second side plate are connected to and located between bottom plate and top plate. Storage sub-assemblies are movably disposed between first side plate and second side plate. Partitions are disposed between first side plate and second side plate. Opposite ends of each partition are respectively connected to top plate and bottom plate. Partitions separate storage sub-assemblies from one another so that storage sub-assemblies are respectively located in airflow channels that are independent to one another.

5 Claims, 7 Drawing Sheets

(56) References Cited

U.S. PATENT DOCUMENTS

| | | | |
|---|---|---|---|
| 2015/0181750 A1* | 6/2015 | Bailey | H05K 7/20736 361/679.48 |
| 2016/0103472 A1* | 4/2016 | Schuette | G06F 1/189 361/679.33 |
| 2017/0027073 A1* | 1/2017 | Zani | H05K 7/1487 |

* cited by examiner

STORAGE CHASSIS

CROSS-REFERENCE TO RELATED APPLICATIONS

This non-provisional application claims priority under 35 U.S.C. § 119(a) on Patent Application No(s). 201910562278.0 filed in China, on Jun. 26, 2019, the entire contents of which are hereby incorporated by reference.

BACKGROUND OF THE INVENTION

Technical Field of the Invention

The disclosure relates to a storage chassis of a storage assembly, more particularly to a storage chassis of a storage assembly having heat dissipation channels that are independent to one another.

Description of the Related Art

With the advance of the internet, cloud services using a server and the internet have become more widespread. Also, more and more data should be store in the server so as to provide a variety of cloud services. Therefore, more and more storage units should be disposed in a storage chassis of the server.

SUMMARY OF THE INVENTION

One embodiment of this disclosure provides a storage chassis including a base a plurality of storage sub-assemblies and a plurality of partitions. The base includes a bottom plate, a top plate, a first side plate and a second side plate. A front side of the bottom plate is opposite to a back side of the bottom plate. The bottom plate is located opposite to the top plate. The first side plate is located opposite to the second side plate. The first side plate and the second side plate are connected to and located between the bottom plate and the top plate. The storage sub-assemblies are movably disposed between the first side plate and the second side plate. The partitions are disposed between the first side plate and the second side plate. Two opposite ends of each of the partitions are respectively connected to the top plate and the bottom plate. The partitions separate the storage sub-assemblies from one another so that the storage sub-assemblies are respectively located in a plurality of airflow channels that are independent to one another.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
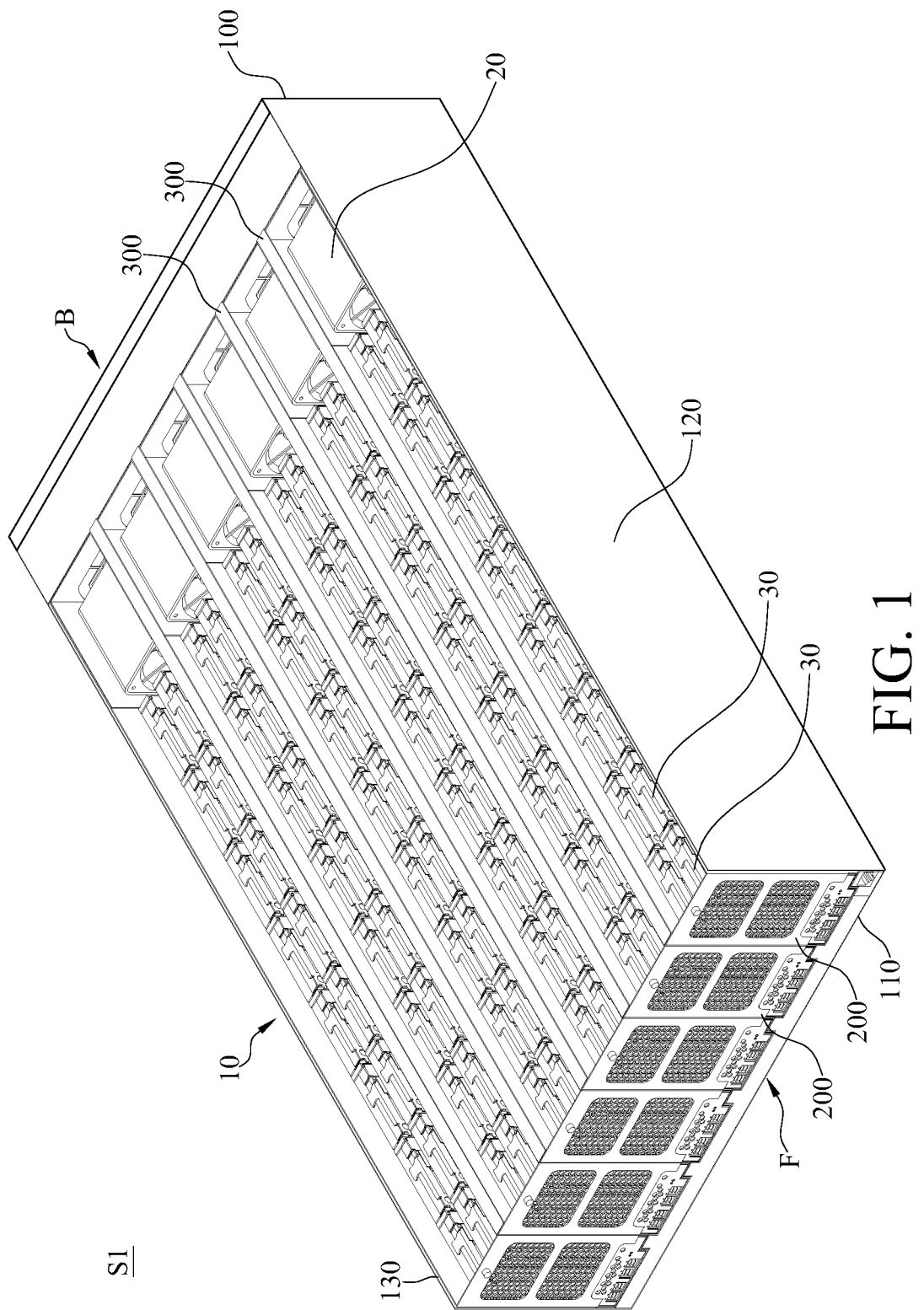
FIG. 1 is a perspective view of a storage assembly according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
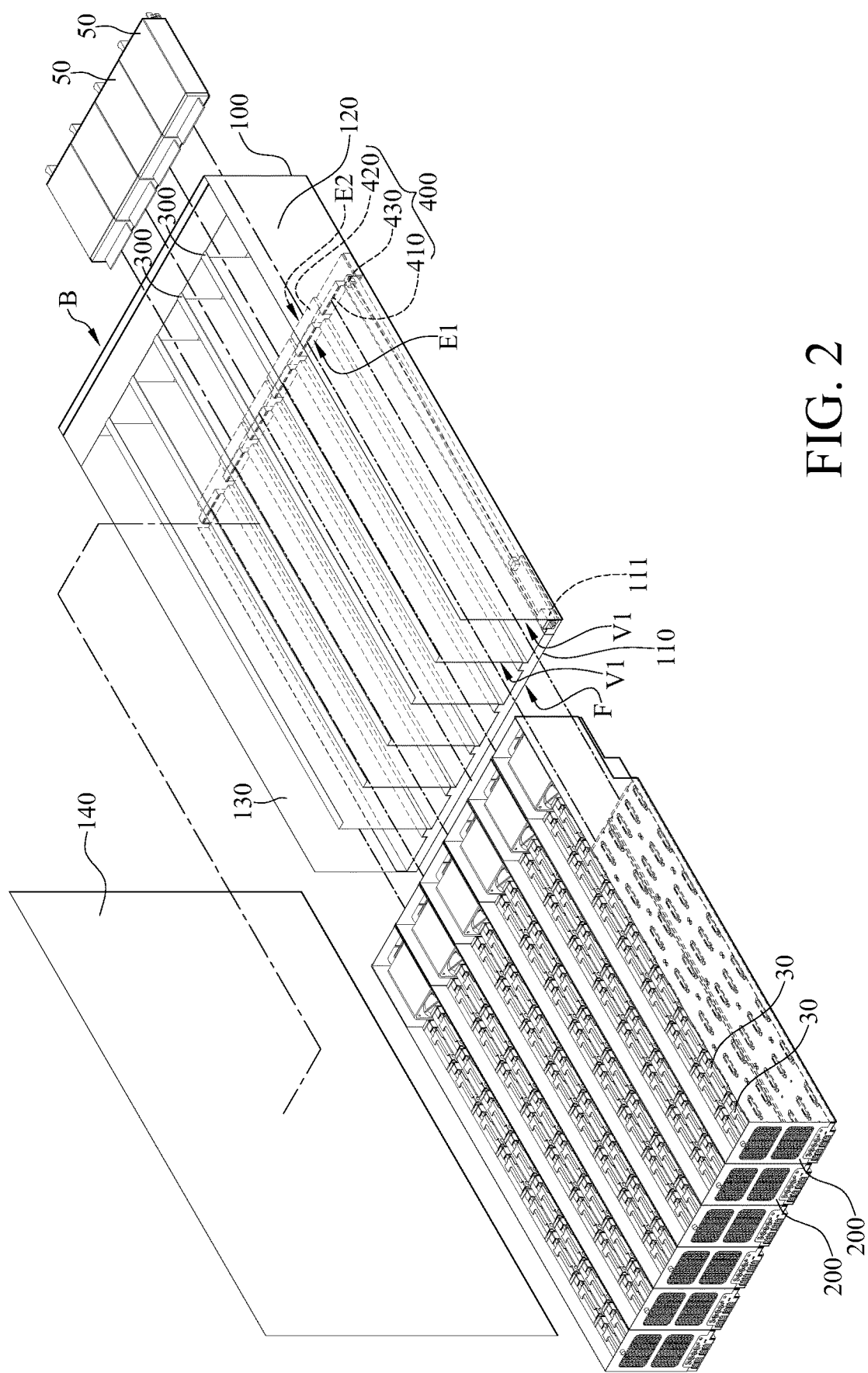
FIG. 2 is an exploded view of the storage assembly according to the embodiment of the disclosure.
Figure 3:
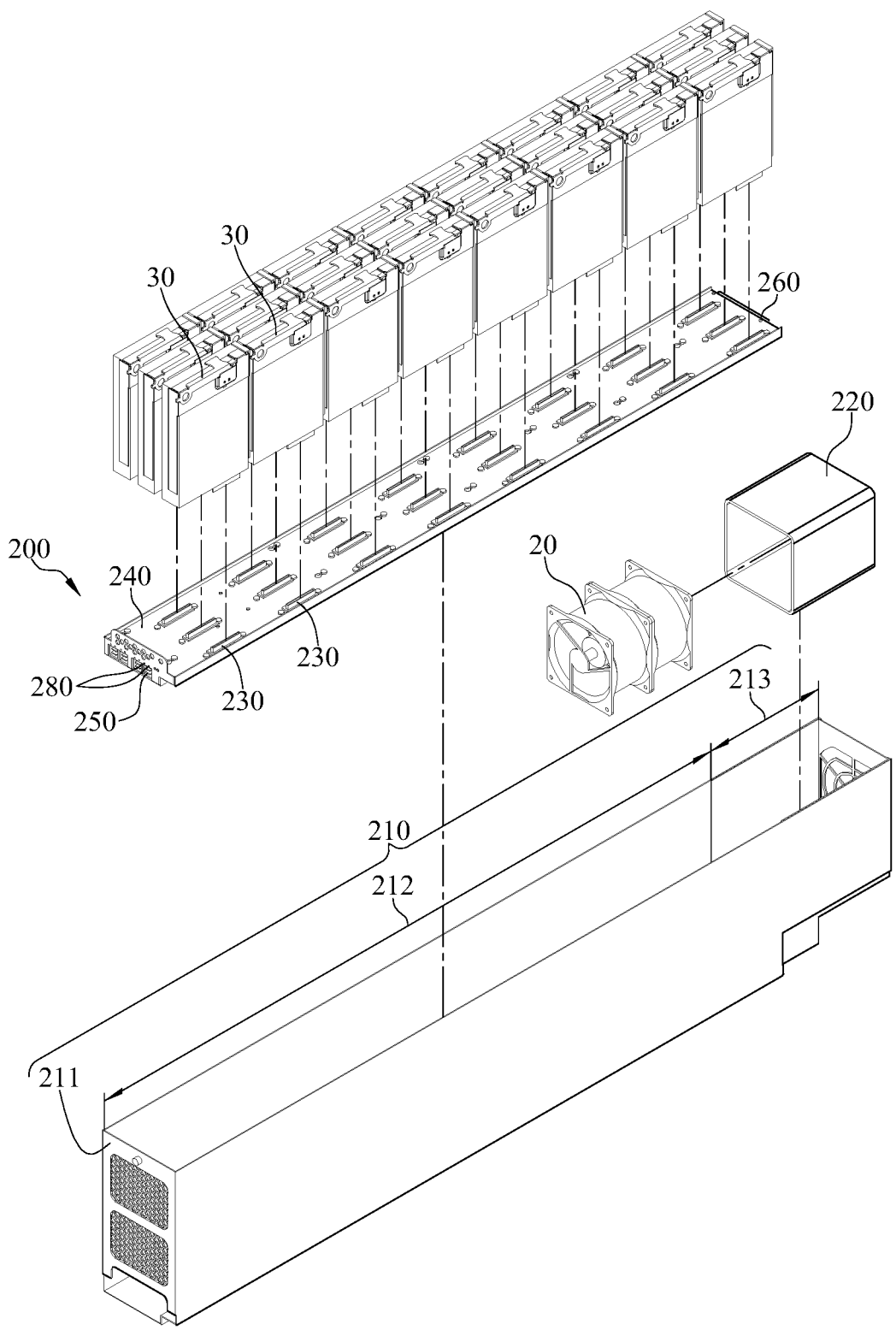
FIG. 3 is an exploded view of a single storage sub-assembly according to the embodiment of the disclosure.
Figure 4:
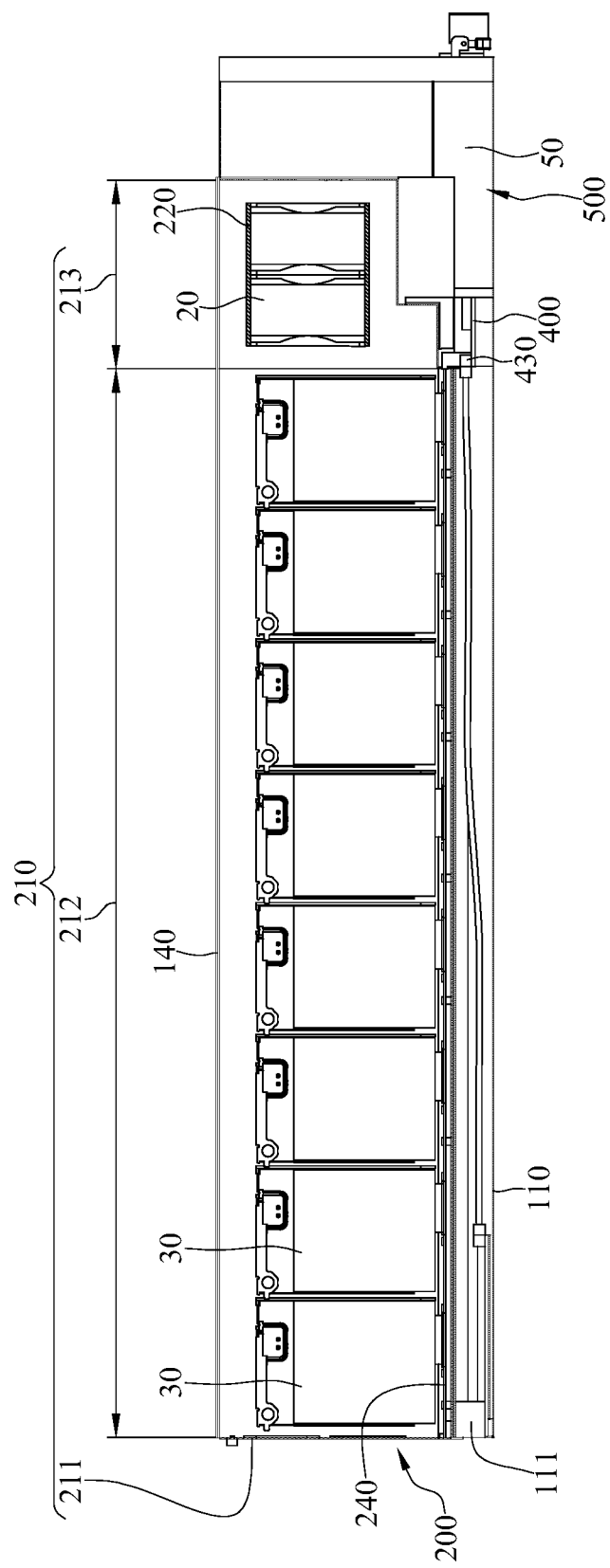
FIG. 4 is a side view of the storage assembly in FIG. 1.
Figure 5:
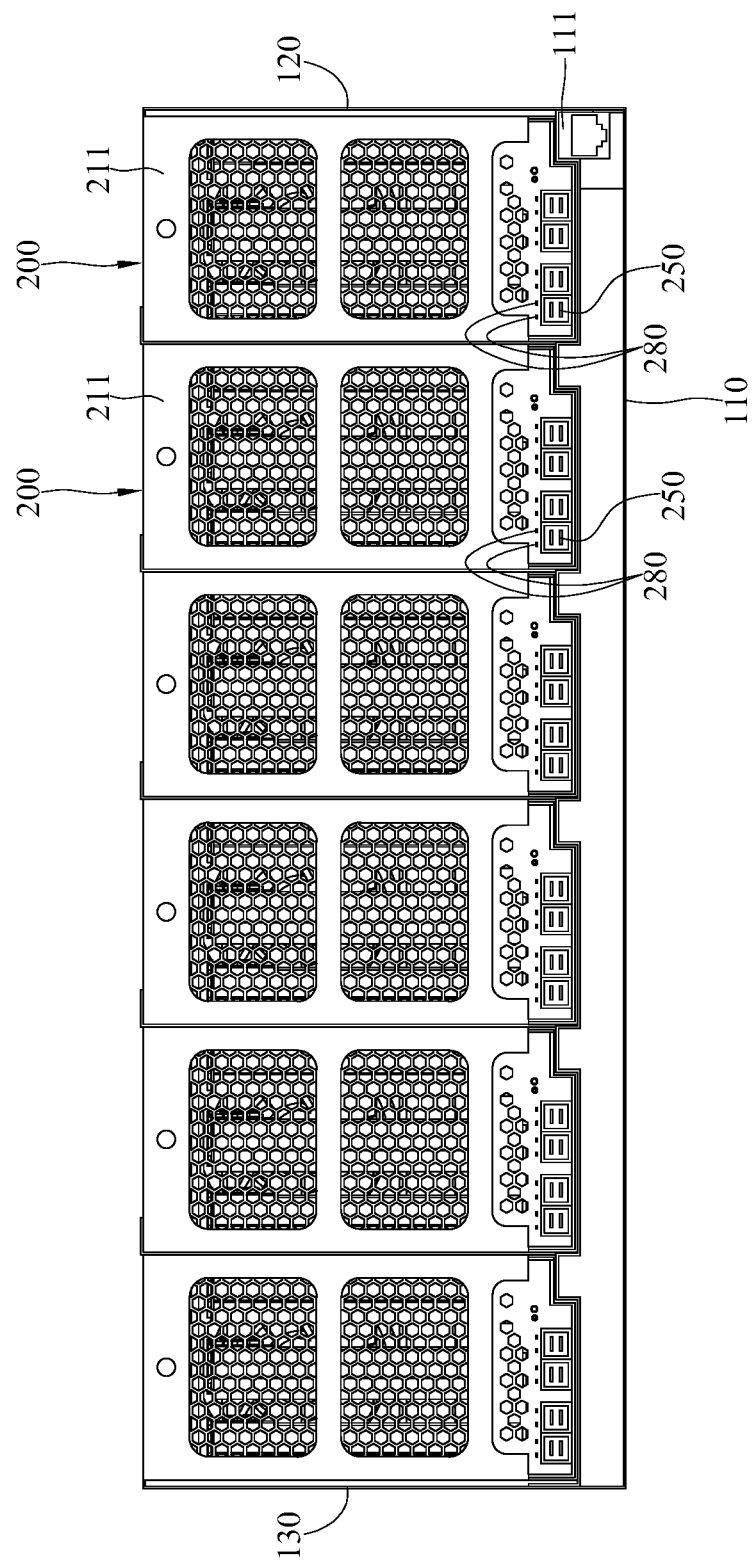
FIG. 5 is a front view of the storage assembly in FIG. 1.
Figure 6:
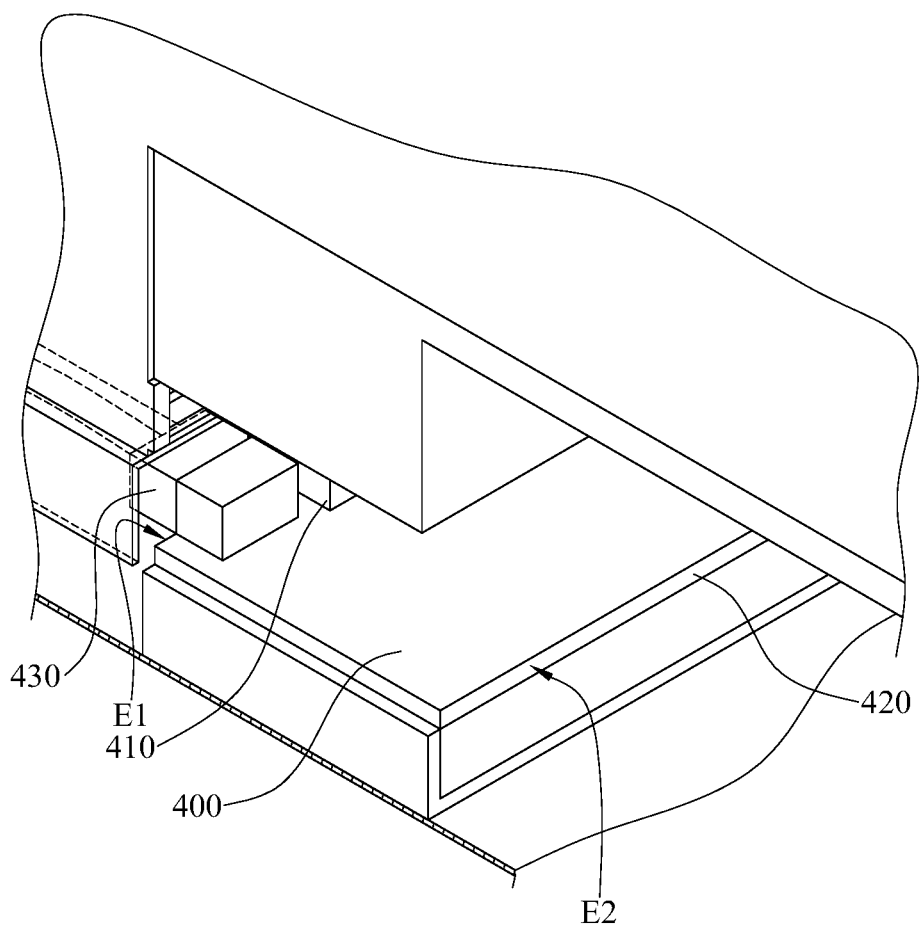
FIG. 6 is a partially enlarged perspective view of the storage assembly in FIG. 2.

Please refer to FIG. 1 to FIG. 6, where FIG. 1 is a perspective view of a storage assembly according to an embodiment of the disclosure, FIG. 2 is an exploded view of the storage assembly according to the embodiment of the disclosure, FIG. 3 is an exploded view of a single storage sub-assembly according to the embodiment of the disclosure, FIG. 4 is a side view of the storage assembly in FIG. 1, FIG. 5 is a front view of the storage assembly in FIG. 1, and FIG. 6 is a partially enlarged perspective view of the storage assembly in FIG. 2. For the purpose of simple illustration, the cables are omitted in the drawings, and the top plate 140 is omitted in FIG. 1.

As shown in FIG. 1 to FIG. 6, this embodiment provides a storage assembly Si including a storage chassis 10, a plurality of fans 20, a plurality of storage units 30 and a plurality of power supplies 50. The fans 20, the storage units 30 and the power supplies 50 are disposed in the storage chassis 10.

The storage chassis 10 includes a base 100, a plurality of storage sub-assemblies 200, a plurality of partitions 300, a power distribution board 400 and a power supply cage 500. The storage sub-assemblies 200, the partitions 300, the power distribution board 400 and the power supply cage 500 are disposed in the base 100. The partitions 300 are spaced apart from one another by a constant internal so as to separate the storage sub-assemblies 200 from one another.

In this embodiment, the base 100 includes a bottom plate 110, a first side plate 120, a second side plate 130 and a top plate 140. The bottom plate 110 has a front side F and a back side B that are opposite to each other. In the following descriptions, a front side of a component faces the front side F, and a back side of that component faces the back side B. The bottom plate 110 is located opposite to the top plate 140. The first side plate 120 is located opposite to the second side plate 130. The first side plate 120 and the second side plate 130 are connected to and located between the bottom plate 110 and the top plate 140.

The bottom plate 110 has a network port 111 that is located adjacent to the front side F. The network port 111 is also located close to the first side plate 120. In other embodiments, the network port 111 may be disposed on the bottom plate 110 and located adjacent to the front side F and the second side plate 130. In still other embodiments, the network port 111 may be disposed on the bottom plate 110 and located adjacent to any position near the front side F. The network port 111 is electrically connected to the power distribution board 400. A network cable can be inserted into and electrically connected to the network port 111.

In this embodiment, the storage sub-assemblies 200 are disposed in the base 100. The storage sub-assemblies 200 are movably disposed between the first side plate 120 and the second side plate 130. Each storage sub-assembly 200 can be slid relative to the bottom plate 110 at the front side F. Therefore, each storage sub-assembly 200 can be independently removed from the base 100. In this embodiment, the storage assembly Si includes six storage sub-assemblies 200. In other embodiments, the quantity of the storage sub-assemblies 200 may be adjusted according to actual requirements.

In this embodiment, each storage sub-assembly 200 includes a storage cage 210, a fan cage 220, a plurality of storage connectors 230, a circuit board 240, a plurality of signal connectors 250, a power connector 260, a protector 270 and a plurality of light emitting devices 280. The fan cage 220, the storage connectors 230, the circuit board 240, the signal connectors 250, the power connector 260, the protector 270 and the light emitting devices 280 are disposed on the storage cage 210. The fan 20 is disposed in the fan cage 220. The storage units 30 are respectively disposed on the storage connectors 230. Each storage sub-assembly 200 may be removed from or installed in the base 100 by sliding each storage cage 210 via the front side F of the bottom plate 110 so that the storage sub-assembly 200 has an operation status and a repairing status.

As shown in FIG. 3 to FIG. 5, each storage cage 210 includes a front part 211, a middle part 212 and a back part 213 that are connected to one another. The front part 211 has a plurality of vents allowing an airflow to flow therethrough. The circuit board 240, the power connector 260 and the storage connectors 230 are disposed on the middle part 212. The power connector 260 is electrically connected to the circuit board 240. The power connector 260 is located on an end of the middle part 212 that is located close to the back side B of the bottom plate 110. The signal connectors 250 and the light emitting devices 280 are disposed on the circuit board 240. The signal connectors 250 are located on the middle part 212 and close to the bottom plate 110. The signal connectors 250 are configured to be electrically connected to external electronic components (not shown). The light emitting devices 280 used for alarming are respectively corresponding to the storage connectors 230. When the storage units 30 disposed on one of the storage sub-assemblies 200 are broken, the corresponding light emitting device 280, such as light emitting diode (LED), emits light as an alarm, and this does not affect operations of the storage units 30 disposed in other storage sub-assemblies 200. In this embodiment, there are eight light emitting devices 280 disposed on the circuit board 240; however, in other embodiments, the quantity of the light emitting devices 280 may be adjusted according to actual requirements. In still other embodiments, the storage sub-assembly may not include the light emitting devices 280.

The storage connectors 230 are disposed on the circuit board 240 and located above the power connector 260. The storage units 30 are respectively disposed on the storage connectors 230 so as to be electrically connected to the circuit board 240. In this embodiment, each storage cage 210 has twenty-four storage connectors 230. In other embodiments, a quantity of the storage connectors 230 may be adjusted according to actual requirements, and the quantity of the storage units 30 may be adjusted accordingly.

The fan cage 220 is disposed on the back part 213 and located close to the back side B of the bottom plate 110. The fan cage 220 is located on back sides of the storage connectors 230. The fan cage 220 is configured for accommodating the fan 20. A back surface of the back part 213 is configured to support the fan cage 220 and prevent an airflow generated by the fan 20 from flowing backwards. The fan 20 is electrically connected to the power distribution board 400 via the power connector 260. The airflow generated by the fan 20 flows frontward so as to dissipate the heat generated by the storage units 30 located on the front side of the fan cage 220.

In this embodiment, the partitions 300 are located between the first side plate 120 and the second side plate 130. The opposite sides of each of the partitions 300 are respectively connected to the top plate 140 and the bottom plate 110. The partitions 300 are configured to support and separate the storage sub-assemblies 200. The partitions 300 are located between the first side plate 120 and the second side plate 130 and are spaced apart from one another, such that a plurality of independent airflow channels V1 are formed between the first side plate 120, the second side plate 130 and the partitions 300. The storage sub-assemblies 200 are respectively located in the airflow channels V1 that are independent to one another. Therefore, for one of the airflow channels V1 and the storage sub-assembly 200 located therein, the airflow generated by the fan 20 disposed in the fan cage 220 can flow through that airflow channel V1 and dissipate the heat generated by that storage sub-assembly 200, and such airflow would not flow into other airflow channels adjacent that airflow channel V1, thereby reaching independent heat dissipation. In addition, small gaps at the intersection of the partition 300 and the bottom plate 110 or that of the partition 300 and the top plate 140 may be filled will a piece of foam so as to optimize the above independent heat dissipation. Small gaps on corners of the base 100 may also be filled with other pieces of foam as well so as to prevent the airflow from flowing into such small gaps.

In this embodiment, the power distribution board 400 is disposed on the bottom plate 110 and located close to the back side B of the bottom plate 110. The power distribution board 400 has a plurality of power distribution ports 410, a power supply connector 420 and a network connection port 430. As shown in FIG. 6, the network connection port 430 and the power distribution ports 410 are disposed on a front end E1 of the power distribution board 400. The network connection port 430 is located close to the power distribution port 410. The network connection port 430 is configured for the insertion of a cable that is electrically connected to the network port 111 on the bottom plate 110. The power distribution ports 410 are respectively electrically connected to the power connectors 260 of the storage sub-assemblies 200. The power supply connector 420 is disposed on a back end E2 of the power distribution board 400, and the power supply connector 420 is electrically connected to the power supplies 50.

In this embodiment, the power supply cage 500 is disposed on the bottom plate 110 and located close to the back side B of the bottom plate 110. The power distribution board 400 is located between the power supply cage 500 and the circuit board 240. The power supplies 50 are disposed on the power supply cage 500. The power supply connector 420 is electrically connected to the power supplies 50. In this embodiment, the storage assembly Si includes four power supplies 50. In other embodiments, the quantity of the power supplies may be adjusted according to actual requirements.

Figure 7:
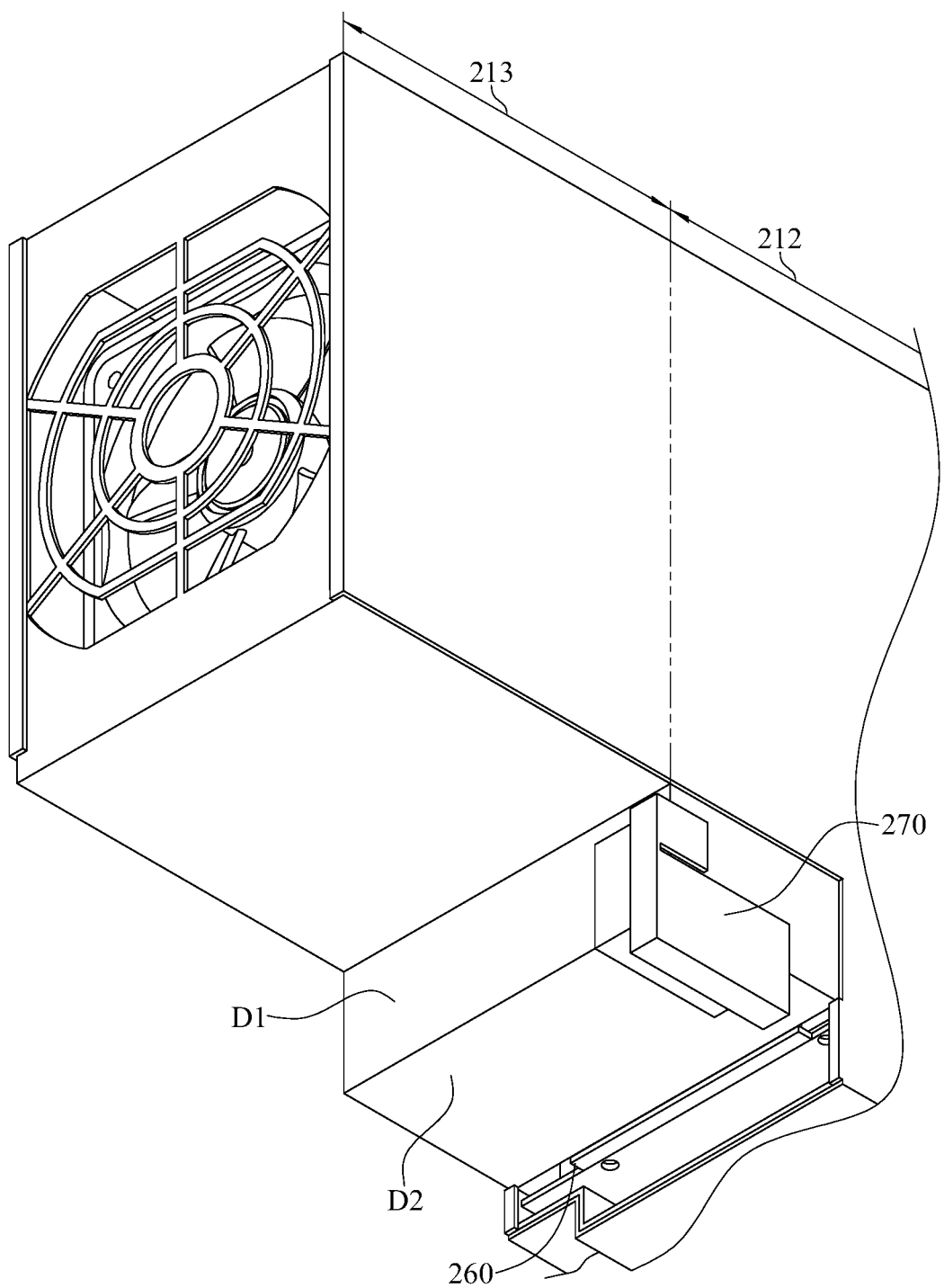
FIG. 7 is a partially enlarged perspective view of the single storage sub-assembly in FIG. 3.

Please refer to FIG. 4 and FIG. 7, where FIG. 7 is a partially enlarged perspective view of the single storage sub-assembly in FIG. 3. As shown in FIG. 7, there is a step surface D1 connected to the middle part 212 and the back part 213. The protector 270 is disposed on the step surface D1. The protector is a bumper for preventing impacts. The protector is located at a point where the middle part 212 and the back part 213 meet. The protector 270 may extend below a bottom surface D2 of the middle part 212. The protector 270 is disposed on a gap between the step surface D1 of the middle part 212 and the power supplies 50. The protector 270 can absorb the impact between the power distribution board 400 and the power supplies 50 and that between the power supplies 50 and the middle part 212.

Hereinafter, the switch from the operation status to the repairing status of the storage sub-assembly 200 is described. When the storage sub-assembly 200 is in the operation status, the storage sub-assembly 200 is located at an operation location, where the storage sub-assembly 200 is totally accommodated in the base 100 and covered by the top plate 140, at least part of the power distribution board 400 is located under the middle part 212, and the power connector 260 disposed on the storage cage 210 is connected to the power distribution port 410 of the power distribution board 400.

When a single storage unit 30 in the storage chassis 10 is damaged or broken, it is necessary to remove or repair the abnormal storage unit 30. In such a case, the front side of the storage sub-assembly 200 including that storage unit 30 is moved relative to the storage chassis 10 so that the front part 211 is slid out from the front side F of the bottom plate 110 thereby making the storage sub-assembly 200 be in the repairing status. When the storage sub-assembly 200 is in the repairing status, the storage sub-assembly 200 is in a maintaining location, the broken storage unit 30 is exposed (that is, not covered by the top plate 140), and the power connector 260 is disconnected from the power distribution port 410 of the power distribution board 400. In this way, the broken storage unit 30 can be disconnected from the corresponding storage connector 230 and removed from the storage sub-assembly 200 without affecting operations of other storage units 30 in other storage sub-assemblies 200. Therefore, the single storage unit 30 can be disposed, removed or repaired in an effective and convenient way without affecting operations of other storage units 30.

After the broken storage unit 30 is removed, a new storage unit 30 can be electrically connected to the storage connector 230 so as to complete the replacement of storage unit 30. Then, the front side of the storage sub-assembly 200 can be pushed back into the front side F of the bottom plate 110 so that the storage sub-assembly 200 is accommodated in the base 100 and the power connector 260 on the storage cage 210 is connected to the power distribution port 410 of the power distribution board 400, thereby making the storage sub-assembly 200 be in the operation status. When the storage sub-assemblies 200 is pushed back into the front side F, the protector 270 can absorb the impact between the power distribution board 400 and the power supplies 50 and that between the power supplies 50 and the middle part 212, such that the power distribution board 400, the power supplies 50 and the middle part 212 are prevented from being damaged due to such impacts.

According to the disclosure, since the partitions separate the storage sub-assemblies from one another so that the storage sub-assemblies are located in respective airflow channels. The independent airflow channels prevent the airflow flowing in one of the airflow channels from flowing into other airflow channels. Therefore, the heat generated by the storage units of the storage sub-assembly can be effectively dissipated by the airflow generated by the fan disposed in the fan cage and flowing through the airflow channel.

In addition, since the storage sub-assemblies are movably disposed on the base, individual storage sub-assembly can be moved so as to expose the single broken storage unit of that storage sub-assembly, thereby allowing the removal of the single broken storage unit without affecting operations of other storage units. Therefore, each storage unit can be disposed, removed or repaired individually in an effective and convenient way without affecting operations of other storage units.

Furthermore, since the protector can absorb the impact between the power distribution board and the power supplies and that between the power supplies and the middle part during the insertion of the storage sub-assembly, such that the power distribution board, the power supplies and the middle part are prevented from being damaged due to such impacts.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A storage chassis, comprising:
   a base, comprising a bottom plate, a top plate, a first side plate and a second side plate, wherein a front side of the bottom plate is opposite to a back side of the bottom plate, the bottom plate is located opposite to the top plate, the first side plate is located opposite to the second side plate, the first side plate and the second side plate are connected to and located between the bottom plate and the top plate;
   a plurality of storage sub-assemblies, movably disposed between the first side plate and the second side plate; and
   a plurality of partitions, disposed between the first side plate and the second side plate, wherein two opposite ends of each of the plurality of partitions are respectively connected to the top plate and the bottom plate, the plurality of partitions separate the plurality of storage sub-assemblies from one another so that the plurality of storage sub-assemblies are respectively located in a plurality of airflow channels that are independent to one another;
   wherein each of the plurality of storage sub-assemblies comprises a storage cage, a fan cage and a plurality of storage connectors,
   in each of the plurality of storage sub-assemblies, the fan cage is disposed on the storage cage and located on an end of the storage cage that is located close to the back side of the bottom plate, and the plurality of connectors are disposed on the storage cage;
   wherein each of the plurality of storage sub-assemblies further comprises a circuit board disposed on the storage cage;
   wherein each of the plurality of storage sub-assemblies further comprises a plurality of signal connectors,
   in each of the plurality of storage sub-assemblies, the storage cage comprises a front part, a middle part and a back part that are connected to one another, the plurality of signal connectors are disposed on the front part, the plurality of storage connectors are disposed on the middle part, and the fan cage is disposed on the back part;
   wherein each of the plurality of storage sub-assemblies further comprises a power connector, in each of the plurality of storage sub-assemblies, the power connector is disposed on the middle part, and the power connector is connected to the circuit board; and
   wherein the storage chassis further comprises a power distribution board disposed on the bottom plate and located adjacent to the back side of the bottom plate, the power distribution board has a plurality of power distribution ports and a power supply connector, the plurality of power distribution ports are disposed on a front end of the power distribution board, the plurality of power distribution ports are respectively electrically connected to the plurality of power connectors, and the power supply connector is disposed on a back end of the power distribution board.

2. The storage chassis according to claim 1, further comprising a power supply cage disposed on the bottom plate and located on an end of the bottom plate that is located close to the back side, wherein the power distribution board is located between the power supply cage and the plurality of circuit boards.

3. The storage chassis according to claim 1, wherein each of the plurality of storage sub-assemblies further comprises a protector;
   wherein the protector is a bumper for preventing impacts; and
   wherein the protector is located at a point where the middle part and the back part meet.

4. The storage chassis according to claim 3, wherein the protector extends below a bottom surface of the middle part.

5. The storage chassis according to claim 1, further comprising a network port disposed on the front side of the bottom plate, and the power distribution board further comprising a network connection port connected to the network port.

* * * * *